Nov. 28, 1967 S. S. BAIRD ETAL 3,355,291
APPLICATION OF GLASS TO SEMICONDUCTOR DEVICES
Filed Oct. 8, 1963
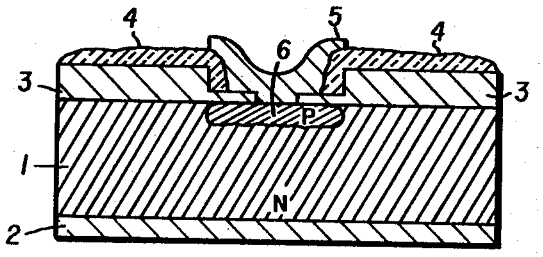
Stephen S. Baird
James A. Cunningham
INVENTORS
BY John G. Graham United States Patent Office 3,355,291

Patented Nov. 28, 1967

3,355,291

APPLICATION OF GLASS TO SEMICONDUCTOR DEVICES

Stephen S. Baird, Richardson, and James A. Cunningham, Dallas, Tex., assignors to Texas Instruments Incorporated, Dallas, Tex., a corporation of Delaware Filed Oct. 8, 1963, Ser. No. 314,743

7 Claims. (Cl. 96—27)

ABSTRACT OF THE DISCLOSURE

Disclosed is a method of applying a coating of glass onto defined areas by depositing glass particles mixed with a photoresist polymer upon the surface of the substrate, photo defining the surfaces to be covered with the glass and then heating to fuse the glass and burn away the photosensitive polymer.

This invention relates to semiconductor devices and more particularly to a method of selectively applying a layer of glass to semiconductor devices.

The controlling and passivating of semiconductor surfaces is of great interest to the semiconductor industry. One particular process of interest is encapsulation with glass whereby all junctions are sealed and protected by a layer of glass. Methods of glass encapsulation may be divided into two general categories: those in which glass is applied after the electrical contacts have been made to the device and those in which glass is applied before electrical contacts have been made to the device.

Difficulties have arisen with both methods. Glasses that have suitable thermal expansivity characteristics have correspondingly high melting temperatures which tend to dissolve away or melt the contacts and leads during the sealing and fusing operation. Devices have been made using lead borate glasses with low melting temperatures and high expansivities. The expansivity mismatch between the glasses and the semiconductor is so great that reliability problems result.

The application of the glass before attaching the contacts heretofore has not proved very satisfactory because a suitable method for applying the glass was not available. Selective etching, by means of a photoresist technique, through a continuous and relatively thick film of glass to provide openings for contact areas is not practical due to severe undercutting problems.

It is then an object of the invention to provide a method of selectively applying a glass film to a semiconductor device;

Another object is to provide a method of preparing glass to be selectively applied to a semiconductor;

Still another object is to provide a method of applying glass to a semiconductor device before attaching the electrical contacts thereto;

Other objects and features will become apparent from the following description when taken in conjunction with the appended claims and attached drawing.

The sole figure of the drawing is a sectional view of a device showing a resultant layer of glass and a contact which has been deposited in an opening in the glass.

The invention relates to a method for selectively applying glass to a silicon or other semiconductor substrate. The glass layer can be applied in any desired pattern, leaving the areas of the device that are required for electrical contacts completely bare.

In practicing the method, a slurry of glass in a photoresist polymer, for example Kodak, KMER, is prepared. Using this slurry in a conventional photomasking method, using an appropriate mask, a layer of the glass and polymer is deposited onto the surface of the device. The coated device is then exposed and processed to develop the configuration left there by the photo masking. The device is placed into a furnace provided with flowing oxygen and submitted to a temperature sufficiently high to melt the glass. The polymer is burned away and the glass fused onto the surface of the device.

The method of preparing the glass is an essential feature of the invention. The selection of a suitable glass is important. A glass having a coefficient of thermal expansion near that of silicon is desirable. Lead borosilicate glass comes close to meeting this requirement, of which Corning Code 1826 glass is one. In addition, the Corning 1826 glass can be sealed between 725° to 925° C., a temperature at which junction migration in semiconductor devices does not occur.

Prior to preparing the glass-photoresist slurry, the glass must be ground to a fine particle size. The glass is ground in hard polyethylene bottles with extra-hard alumina balls for about 20 hours, using methyl alcohol as a fluid media. Grinding in a porcelain ball mill is to be avoided because resulting $Al_2O_3$ contamination hinders glass flow during fusing. Glass particle size is important as large particles result in large surface lumps in the glass film. In testing the particles ground for 20 hours as described above, it was found that >90% of the particles were finer than 2.5 microns and >50% were finer than 1.7 microns. The particle size will depend upon the size and number of the balls, the size of the bottle and the amount of glass.

Milling in polyethylene containers with extra-hard 96% alumina milling balls eliminates much of the alumina contamination, but polyethylene is added to the glass. This does not present too great of a problem since polyethylene is somewhat soluble in hot xylene. After milling, the methyl alcohol is filtered off. The ground glass is transferred to a beaker about 90% filled with xylene. The glass is stirred into the xylene and a glass hooked rod driven by a motor keeps the suspension of glass stirred during a 48 hour leaching period at about 85° C. Without the leaching operation, the glass paste becomes brown upon heating due to charring of the polyethylene. This would affect the glass film.

After leaching, the xylene is filtered off using a coarse glass frit and suction while rinsing several times with hot xylene. The glass is left in a paste state. Any attempts to dry the glass only creates agglomerates that must be broken down by re-milling.

Since the glass cannot be dried satisfactorily, it is necessary to get a consistent glass paste each time. The procedure is as follows: (1) Suction is continued until visible liquid is gone. (2) Paste glass is transferred to a weighed storage bottle and capped. Bottle is shaken vigorously to insure homogeneity of paste. (3) A sample of the paste is transferred to a preweighed weighing bottle and immediately capped. Weight of paste glass is obtained and the xylene is then removed by evaporation at 100° C. for 16 hours. The dried glass is then weighed and the weight percent of xylene in the paste can be calculated. (4) The percent xylene in the storage bottle can then be adjusted to the desired level by xylene addition or evaporation. (5) Weights taken periodically showed that evaporation loss at room temperature would not affect the concentration seriously if the storage bottle was kept open only while withdrawing glass to be weighed. It was shown that ~5% of the xylene present evaporated at room temperature over a two hour test period.

In making up the slurry, Eastman Kodak KMER photoresist compound, for example, may be used. The KMER is made more viscous by evaporation until it is approximately 1.15 more viscous than KMER is when received. A slurry mixture is made by mixing by weight 35% glass, 45% KMER, and 20% xylene or thinner. This slurry forms suspensions stable over many weeks. This is advantageous in that one slurry batch will give consistent glass film with very slight variation over a long period of time.

In mixing, the glass paste of known percentage of xylene, is weighed out and if thinner is needed it is added and stirred in. The KMER is stirred into the paste mixture and the slurry is transferred from the weighing beaker into a small porcelain ball mill. Weighing and mixing must be done in photoresist insensitive light, e.g., yellow light.

The slurry is milled in a small mill with ½ inch extra-hard alumina balls at 150 r.p.m. for 24 hours, or a time sufficient to break up glass agglomerates. The high viscosity of the slurry prevents much $Al_2O_3$ contamination and significant individual particle size reduction. The slurry must be fairly uniform before milling, as large lumps of glass agglomerates will not otherwise be affected.

Application of the slurry to the semiconductor device is by spinning. Due to the high viscosity of the slurry a high speed, on the order of 6,000 r.p.m., is necessary. Only enough slurry to cover the slice before spinning is necessary. Subsequent to spinning, the slice is dried by baking at 150° C. in a vacuum for five minutes before exposure. Exposure is by any suitable means. Due to the suspended glass, exposure time is longer for the slurry than for plain KMER.

Spraying time and the amount of developer needed are both greater than for plain KMER. The developing spray must be directed at an angle to the unexposed surface to get a flushing of the glass particles out of small areas.

After development, the slices are dried before firing. If the slices are not completely dry, they will catch fire upon introduction into an oxygen atmosphere at 500° C., causing a disrupted glass surface.

A covering of thermal silicon oxide should be placed over the junction and surfaces to which glass is applied. Over the oxide the Corning 1826 glass forms a transparent film of glassy appearance, but if the glass is applied directly over the slices, a glass-silicon interaction occurs giving the glass a dark appearance. For a firing at 800° C. for 10 minutes, an oxide of at least 7,000 angstroms is necessary.

For purposes of illustration, a semiconductor device coated with glass by the method herein disclosed is shown in the sole figure of the drawing. Shown is a planar diode having an N-doped region 1 with a P-doped region 6 diffused therein. An oxide coating 3 lies on the surface of the device covering the junction between the P- and N-doped regions. A glass coating 4 has been applied over the oxide 3, leaving an opening over the P-doped region. A contact 5 is attached through the opening in the glass and oxide to the P-region 6. A second contact 2 is attached to the N-region 1.

Although the present invention has been illustrated in terms of specific preferred steps and procedures and reference is made to a specific embodiment, it will be apparent that changes and modifications are possible without departing from the spirit and scope of the invention as defined in the appended claims.

We claim:

1. The method of selectively applying a layer of glass to a semiconductor device comprising the steps of: applying a slurry of glass in a photoresist polymer to the surface of a semiconductor device, exposing the surface of the device through a mask to a light source, developing the photoresist polymer to form the configuration left by the mask, heating the device in an oven containing an oxygen atmosphere to a temperature sufficiently high to melt the glass deposited thereon and to burn away the polymer remaining on the device.

2. The method of selectively applying a layer of glass to a semiconductor device comprising the steps of: coating the surface of a semiconductor device with a glass slurry-photoresist polymer mixture, placing a mask over the coated surface, exposing said masked surface to a light source, developing said exposed surface to form the configuration produced by exposing said masked coated surface to a light source and to remove unwanted glass-polymer mixture, heating the device in an oven to melt the glass and fuse it together and to the surface of the device and directing a stream of oxygen through the oven while heating to burn away the remaining polymer.

3. The method as defined in claim 1, wherein the mixture of glass slurry is prepared by: milling the glass in hard polyethylene bottles with extra-hard alumina balls using methyl alcohol as a fluid media, filtering off the methyl alcohol after milling, stirring the ground glass into a beaker about 90% filled with xylene and continuing to stir for a 48-hour leaching period, filtering off the xylene using a coarse glass frit and suction while rinsing several times with hot xylene and mixing the ground glass about 35% by weight with about 45% by weight of photoresist polymer and about 20% by weight of xylene.

4. The method as defined in claim 3, wherein the glass used is lead borosilicate glass.

5. The method as defined in claim 2, wherein the oven is heated to a temperature between 725° C. and 925° C.

6. The method as defined in claim 3, wherein the glass is ground to particle sizes of which more than 90% are less than 2.5 microns in diameter.

7. The method of selectively applying a layer of glass to a semiconductor device comprising the steps of: applying a mixture of finely ground glass and photoresist polymer to the surface of a semiconductor device, drying in a vacuum at 150° C. for five minutes, masking the coated surface in a desired configuration, exposing the masked surface to a source of light, developing the coated surface to form the configuration thereon and to remove unwanted glass-photoresist polymer and heating in an oven with oxygen flowing therein to fuse the glass and burn away the remaining polymer.

No references cited.

NORMAN G. TORCHIN, *Primary Examiner.*

J. H. RAUBITCHEK, *Assistant Examiner.*